(12) United States Patent
Tomomatsu et al.

(10) Patent No.: US 7,211,837 B2
(45) Date of Patent: May 1, 2007

(54) INSULATED GATE SEMICONDUCTOR DEVICE

(75) Inventors: Yoshifumi Tomomatsu, Fukuoka (JP); Hideki Takahashi, Tokyo (JP); Chihiro Tadokoro, Tokyo (JP)

(73) Assignee: Mitsubishi Denki Kabushiki Kaisha, Chiyoda-ku, Tokyo (JP)

( * ) Notice: Subject to any disclaimer, the term of this patent is extended or adjusted under 35 U.S.C. 154(b) by 67 days.

(21) Appl. No.: 11/076,889

(22) Filed: Mar. 11, 2005

(65) Prior Publication Data

US 2005/0263853 A1    Dec. 1, 2005

(30) Foreign Application Priority Data

May 31, 2004    (JP) .............................. 2004-161359

(51) Int. Cl.
*H01L 29/74*    (2006.01)
*H01L 31/111*   (2006.01)
(52) U.S. Cl. ................ 257/156; 257/331; 257/E29.201
(58) Field of Classification Search ................ 257/107, 257/131, 133, 135, 154, 155, 164, 165, 166, 257/168, 169, 170, 177, 328–332, 339, 341, 257/342, 156, 172; 438/138
See application file for complete search history.

(56) References Cited

U.S. PATENT DOCUMENTS 6,781,200 B2    8/2004    Ishimura et al.

FOREIGN PATENT DOCUMENTS

JP    2003-224278    8/2003

*Primary Examiner*—B. William Baumeister
*Assistant Examiner*—Dana Farahani
(74) *Attorney, Agent, or Firm*—Buchanan Ingersoll & Rooney PC

(57) ABSTRACT

A CSTBT includes a carrier stored layer (113) formed between a P base region (104) and a semiconductor substrate (103) and the carrier stored layer has an impurity concentration higher than that of the semiconductor substrate (103). The P base region (104) in a periphery of a gate electrode (110) functions as a channel. When it is assumed that an impurity concentration of a first carrier stored layer region (113a) just under the channel is ND1 and an impurity concentration of a second carrier stored layer region (113b) other than just under the channel is ND2 in the carrier stored layer (113), the relationship of the impurity concentrations is defined by ND1<ND2. Thus, a gate capacity and a short-circuit current can be controlled and variation in threshold voltage can be prevented.

8 Claims, 16 Drawing Sheets

INSULATED GATE SEMICONDUCTOR DEVICE

BACKGROUND OF THE INVENTION

1. Field of the Invention

The present invention relates to an insulated gate semiconductor device, and more particularly, relates to an insulated gate semiconductor device such as a bipolar transistor and a power MOSFET having an insulated gate, in which an excessive short-circuit current is controlled by suppressing a voltage rise between a gate and an emitter, which occurs when a switching operation is performed at a time of short-circuiting such as a load.

2. Description of the Related Art

In a general power electronics device for driving a motor and the like, a power semiconductor element of such as an insulated gate bipolar transistor (referred to as "IGBT" hereinafter) is mainly used as a switching element in a region where a rated voltage is 300V or more because of its characteristics. Especially, a lot of attention has been lately attracted to an insulated gate semiconductor device having a trench gate, that is, an insulated gate semiconductor device having a structure in which a gate electrode is buried in a trench formed on one main face of a semiconductor substrate. This is because an insulated gate semiconductor device can be easily miniaturized so that a degree of integration thereof can be enhanced. In recent years, an IGBT chip is improved to have a rating current in ampere to a few hundred amperes, thereby allowing a power module to be miniaturized.

FIG. 13 is a sectional view schematically showing an example of a structure of a conventional trench gate IGBT (i.e., Trench Gate Bipolar Transistor) which is referred to as "TIGBT" hereinafter. A structure and an operation of the TIGBT will be described with reference to FIG. 13.

According to a constitution shown in FIG. 13, an $N^+$ buffer layer 102 is formed on a $P^+$ substrate 101 which is a P collector layer, and a collector electrode 112 is formed on the other face of the $P^+$ substrate 101. An $N^-$ semiconductor (base) layer 103 is formed on the $N^+$ buffer layer 102, and a P base region 104 is selectively formed on the $N^-$ semiconductor layer 103 in a cell region of the TIGBT by diffusing P type impurities. $N^+$ emitter region 105 is formed on a part or a whole of the face of the P base region 104 by selectively diffusing high-concentration N type impurities.

According to the constitution in FIG. 13, a plurality of trenches 107 are formed so as to intersect the $N^+$ emitter regions 105 at right angles. Each trench is formed to extend from a top of the $N^+$ emitter region 105 to a depth reaching the inside of the $N^-$ semiconductor layer 103. A trench gate electrode 110 of a MOS transistor is buried in each of the trenches 107 through a gate insulating oxide film 108. The P base region 104 which is located in the periphery of the gate electrode 110 and sandwiched between the $N^+$ emitter region 105 and the $N^-$ semiconductor layer 103 functions as a channel region. An upper face of the gate electrode 110 is covered with an interlayer insulation film 109, and an emitter electrode 111 is formed to cover the interlayer insulation film 109.

FIG. 14 is a sectional view schematically showing a structure of a carrier stored TIGBT (i.e., Carrier Stored Trench-gate Bipolar Transistor: referred to as "CSTBT" hereinafter) which was devised by the inventors of the present invention to improve characteristics of the TIGBT. According to the CSTBT, an $N^-$ semiconductor layer, that is, a carrier stored region 113 (referred to as "CS layer" hereinafter) for storing carriers is formed between the P base region 104 and the $N^-$ semiconductor (base) layer 103.

An operation of the conventional IGBT will be described with reference to FIGS. 13 and 14. While a predetermined positive collector voltage $V_{CE}$ is applied between the emitter electrode 111 and the collector electrode 112, a predetermined positive gate voltage $V_{GE}$ is applied between the emitter electrode 111 and the gate electrode 110 to turn on the gate. At this time, the channel region of the P base region 104 is changed from P type to N type to form a channel. Then, electrons are introduced from the emitter electrode 111 to the $N^-$ semiconductor layer 103 through the channel region. Thus, a forward bias state is formed between the $P^+$ substrate (collector) 101 and the $N^-$ semiconductor layer 103 by the introduced electrons, and holes are introduced from the $P^+$ substrate 101. Thus, the resistance of the $N^-$ semiconductor layer 103 is largely decreased and ON resistance of the IGBT is largely decreased, so that a current capacity is increased. That is, when the (positive) holes are introduced from the P substrate 101, the resistance of the $N^-$ semiconductor layer 103 is decreased.

Next, an operation when the IGBT is turned off will be described. Referring to the constitution shown in FIGS. 13 and 14, the gate voltage $V_{GE}$ applied between the emitter electrode 111 and the gate electrode 110 in an ON state is made to be zero or negative (reverse bias), so that the channel region previously changed to the N type is returned to the P type region. Thus, the introduction of the electrons from from the emitter electrode 111 to the $N^-$ semiconductor layer 103 is stopped. When the introduction of the electrons is stopped, the introduction of the holes from the $P^+$ substrate 101 is also stopped. Then, the electrons and holes stored in the $N^-$ semiconductor layer 103 (and $N^+$ buffer layer 102) are collected into the collector electrode 112 and the emitter electrode 111, respectively, or recombined with each other and disappear.

In the case of the TIGBT shown in FIG. 13, since the MOS transistor can be miniaturized to be about ⅒ on the surface also as compared with a planar gate typed IGBT, its characteristics can be improved. In addition, according to the planar typed IGBT, a current path is formed on a surface sandwiched by P base layers and an amount of voltage drop is large at this part. In contrast, according to the above TIGBT, since the gate electrode 110 is formed so as to penetrate the P base layer 104 and there is no region which is sandwiched by the P base layers, its characteristics can be improved.

In the case of the CSTBT shown in FIG. 14, since the CS layer 113 for storing the carriers is formed under the P base region 104, the holes from the $P^+$ substrate 101 are prevented from passing to the emitter electrode 111 and the holes are stored in the CS layer 113. As a result, the ON voltage can be further lowered as compared with the TIGBT.

However, in the case of the TIGBT shown in FIG. 13, since the cell size is reduced to be about ⅒ as compared with the planar gate, there is an advantage such that the ON voltage can be considerably lowered while there is a problem such that a gate capacity and a short-circuit current are increased. In order to solve the problem, it is proposed that the cell size is increased by increasing a pitch forming the trench gate. However, when the cell size is increased, the ON voltage is raised in the TIGBT.

Meanwhile, in the case of the CSTBT shown in FIG. 14, when the cell size is increased, the ON voltage is prevented from being increased, but there is a problem such that a withstand voltage is lowered. Especially, if the withstand voltage is lowered, a switching element receives a fatal defect, so that the above problem cannot be solved by simply increasing the cell size.

FIGS. 15 and 16 show results of dependency in variation of the withstand voltage (FIG. 15) and variation of the ON voltage (FIG. 16) when a P base interval (trench interval) is increased in the TIGBT and the CSTBT, by way of device simulation. Here, the result is shown in a case where the P base interval in the TIGBT and CSTBT is set at 3 μm and the trench interval (P base interval) is increased to 11 μm in the conventional TIGBT and the CSTBT. When the trench interval is 11 μm, the cell size is increased threefold and the gate capacity decreased to ⅓, compared to the conventional case.

From the illustrated simulation calculation result, in the TIGBT (shown by •), even when the trench interval is increased, the withstand voltage is not changed so much (FIG. 15), but the ON voltage is rapidly increased (FIG. 16). Meanwhile, in the CSTBT (shown by Δ), even when the trench interval is increased, the ON voltage is not changed so much (FIG. 16) but the withstand voltage is rapidly lowered (FIG. 15), and when the trench interval is 5 μm, the withstand voltage is less than 200V and when it is 6 μm, the withstand voltage is not more than 100V. When the trench interval is further increased, the withstand voltage becomes almost 0 V. Thus, if the trench interval is increased (that is, the cell size is increased) in order to lower the gate capacity and the short-circuit current, the ON voltage is caused to be increased (in the case of the TIGBT) or the withstand voltage is caused to be lowered (in the case of the CSTBT).

Thus, as a conventional improved type, the inventors of the present invention proposed an improved type of a constitution part in which a gate electrode 110 formed in a trench is connected to an emitter electrode 111 without varying the pitch of the trench gate, for example, as a CSTBT shown in FIG. 17 (cf. Japanese Patent Unexamined Laid-open Publication No. 2003-224278, for example). That is, according to the constitution shown in FIG. 17, the emitter electrode is connected to an upper face of a second gate electrode part 110b.

According to the above constitution, in a cell of the second gate electrode part 110b connected to the emitter electrode, a gate voltage $V_{GE}$ is 0V, and this means that it is a dummy gate region which does not function as a gate. In this case, there is a merit in which a withstand voltage is not caused to be lowered while a cell size is the same as that of the conventional TIGBT and CSTBT. Note that, in the description hereinafter, the terms "gate electrode" directly connected to the emitter electrode as in the above constitution means a dummy gate region.

FIG. 18 is a graph showing a relation between the conventional CS layer concentration (relative value) and in-plane variation of threshold voltage (VGEth) (relative value).

According to the above constitution, the gate capacity and the short-circuit current can be reduced to ⅓ by connecting two trench gates out of three to the emitter electrode in the trench gates region formed in a stripe shape. This means that the gate capacity and the short-circuit current can be relatively freely selected. Thus, from the result of the above-described device simulation, it is found that the CSTBT is a considerably desired device because the ON voltage is less increased in the CSTBT although the ON voltage is increased in the TIGBT.

FIGS. 19 to 23 are schematic views showing a manufacturing flow from a formation step of the CS layer to a formation step of the trench gate in manufacturing steps of the conventional CSTBT. Hereinafter, the manufacturing steps of the CSTBT will be described with reference to FIGS. 19 to 23.

First, as shown in FIG. 19, ion implantation is selectively performed with phosphor, for example, in a step of ion implantation for forming the CS layer. Then, as shown in FIG. 20, the CS layer 113 is formed by thermal diffusion. Then, as shown in FIG. 21, ion implantation is performed with boron, for example, and thermal diffusion is performed so that the P base layer 104 is formed. Then, as shown in FIG. 22, ion implantation is selectively performed with arsenic, for example, and thermal diffusion is performed to form the N$^+$ emitter region 105. Then, as shown in FIG. 23, after the trench 107 is formed, the gate electrode 110 of polysilicon, for example, is formed in the trench through the gate insulating oxide film 108 to form the gate region.

FIGS. 24 and 25 are graphs showing results of simulation calculations of concentration profiles at sectional positions I—I and II—II in the CSTBT provided by the above step in FIG. 23, respectively. As shown in FIGS. 24 and 25, an impurity concentration of the P base layer in the channel region is different from an impurity concentration of the P base layer in the cell center region, that is, an impurity concentration of the CS layer 113 is lower in the cell center region.

However, according to the CSTBT, as its structural characteristic point, the CS layer is provided, but it can be clear from the relation between the CS layer concentration (relative value) and the in-plane variation of the threshold voltage (VGEth) (relative value) shown in FIG. 18, that the variation of the threshold voltage (VGEth) is increased because the CS layer is additionally provided.

Meanwhile, according to the TIGBT, an impurity concentration of the N$^-$ semiconductor layer 103 is about 1.0E14 cm$^{-3}$ and an impurity concentration of the P base region 104 is about 1.0E17 cm$^{-3}$ at a rated voltage of about 600V. Since the P base region 104 is formed on the N$^-$ semiconductor layer 103 by ion implantation and thermal diffusion, for example, even when concentration is varied in the N$^-$ semiconductor layer, concentration variation of the P base region is hardly affected by that.

According to the CSTBT, since the P base region having an impurity concentration of about 1.0E17 cm$^{-3}$ is formed on the CS layer having relatively high impurity concentration of about 1.0E17 cm$^{-3}$, when the concentration of the CS layer is varied, the concentration of the P base region is also varied.

Therefore, there is a problem such that the threshold voltage (VGEth) is largely varied in the CSTBT as compared with the TIGBT. In order to prevent the variation in threshold voltage, it is necessary to improve the management of manufacturing facility. Thus, it is a major issue in the CSTBT to suppress the variation in the threshold voltage (VGEth) although there are several great advantages in the CSTBT.

SUMMARY OF THE INVENTION

The present invention has been made to solve the above problems and it is an object of the present invention to provide an insulated gate semiconductor device in which a gate capacity and a short-circuit current can be controlled and variation in threshold voltage (VGEth) is suppressed in a CSTBT.

In addition, according to the conventional CSTBT, although the CS layer just under the channel region is changed from the N$^-$ layer to the N$^+$ layer because electric charges are stored when the gate voltage is applied, it is ideal that the CS layer other than just under the channel has high concentration as much as possible. However, it was difficult to implement the above ideal concentration in the conventional manufacturing method of the conventional CSTBT shown in FIGS. 19 to 23. That is, it was difficult to lower the ON voltage. Thus, it is another object of the present invention to solve this problem as well.

In order to attain the above objects, an insulated gate semiconductor device according to the present invention includes: a first conductivity type semiconductor substrate; a second conductivity type collector region formed on a lower main face of the first conductivity type semiconductor substrate; a collector electrode connected to the collector region; a second conductivity type base region selectively formed on an upper main face of the first conductivity type semiconductor substrate; a first conductivity type carrier stored layer formed between the base region and the semiconductor substrate and having an impurity concentration higher than that of the semiconductor substrate; a first conductivity type emitter region selectively formed in the base region; a trench selectively formed in the base region and having a depth reaching the first conductivity type semiconductor substrate; a gate electrode buried in the trench through an insulation film; and an emitter electrode connected to both the base region and the emitter region.

The base region located in the periphery of the gate electrode functions as a channel region, and when it is assumed that an impurity concentration of a first carrier stored layer region located just under the channel region is ND1 and an impurity concentration of a second carrier stored layer region other than just under the channel region is ND2 in the carrier stored layer, the relationship between the impurity concentrations is defined by ND1<ND2.

In the above constitution, it is preferable that the impurity concentration ND1 of the first carrier stored layer region and the impurity concentration ND2 of the second carrier stored layer region are defined by ND1<7E16 cm$^{-3}$, ND2<3E17 cm$^{-3}$ and ND2/ND1>5.

In addition, it is preferable that the trench has a first trench and a second trench, and a first gate electrode is buried in the first trench through the insulation film, and a dummy second gate electrode is buried in the second trench through the insulation film, and only the base region located in the periphery of the first gate electrode works as the channel region and the base region located in the periphery of the dummy second gate electrode does not work as the channel region.

According to the present invention, there can be provided the insulated gate semiconductor device having the above constitution, in which the gate capacity and the short-circuit current can be controlled, and the variation in the threshold voltage (VGEth) can be suppressed. Furthermore, although the CS layer region just under the channel is changed from N$^-$ layer to N$^+$ layer because charges are stored when the gate voltage is applied, the CS layer region other than just under the channel can have a high concentration as much as possible in the CSTBT of the present invention, and therefore the ON voltage reduction can be implemented.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

Figure 1:
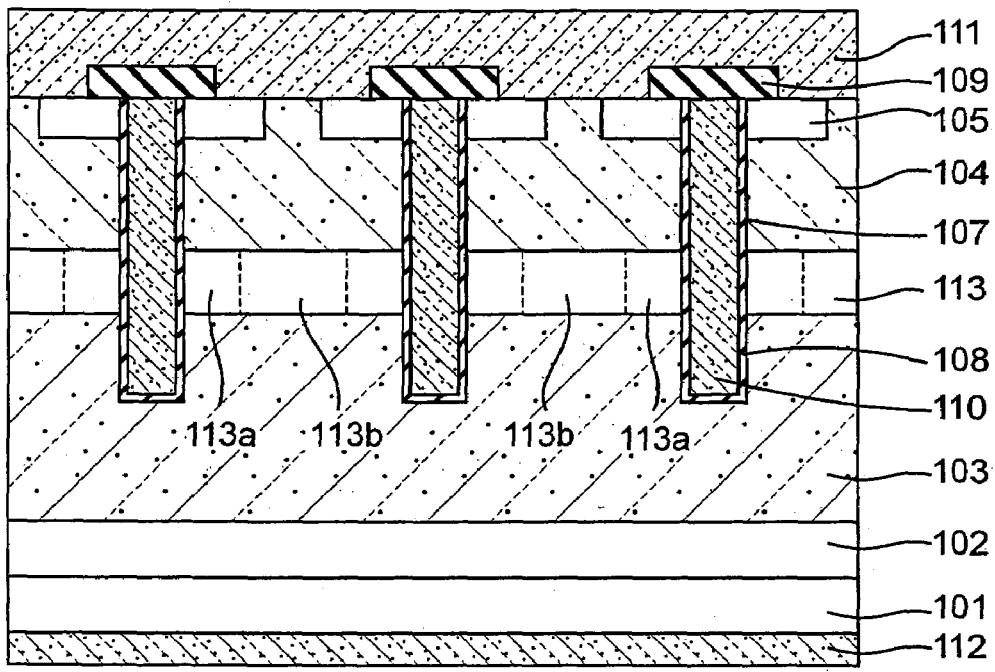
FIG. 1 is a sectional view schematically showing an example of a CSTBT according to an embodiment 1 of the present invention.

Embodiments of the present invention will be described with reference to the accompanying drawings hereinafter. Here, the same reference numerals are allotted to common components in each figure and overlapped descriptions are omitted. The embodiments of the present invention will be described with reference to FIGS. 1 to 12 using a CSTBT as a representative example. However, the present invention is not limited to the CSTBT and can be applied to other IGBT and MOS transistor.

(Embodiment 1)

FIG. 1 is a sectional view schematically showing an example of a CSTBT according to an embodiment 1 of the present invention. In the CSTBT of the embodiment 1, a CS layer 113 comprises a first CS layer region 113$a$ just under a channel region and a second CS layer region 113$b$ other than just under the channel region, in which variation in threshold voltage (VGEth) is controlled by lowering an impurity concentration of the first CS layer region 113$a$. In addition, a carrier storing effect can be maintained by increasing a concentration of the second CS layer region 113$b$ other than just under the channel region, so that an ON voltage can be lowered.

Its structure will be described with reference to FIG. 1 hereinafter. According to an illustrated constitution, an $N^+$ buffer layer 102 is formed on a $P^+$ substrate 101 which is a collector region, and a collector electrode 112 is formed on a back face of the $P^+$ substrate 101. An $N^-$ semiconductor (base) layer 103 is formed on the $N^+$ buffer layer 102. In a cell region, the carrier stored region (CS layer) 113 is formed on the $N^-$ semiconductor layer 103. The carrier stored region (CS layer) 113 is an $N^-$ semiconductor layer for storing carriers and has an impurity concentration higher than that of the $N^-$ semiconductor layer 103. A P base region 104 is selectively formed on the carrier stored region 113 by diffusing P type impurities. An $N^+$ emitter region 105 is formed on a part of the P base region 104 by selectively diffusing high-concentration N type impurities.

In the above constitution, the $N^-$ layer (CS layer) 113 for storing carriers is provided between the P base region 104 and the $N^-$ semiconductor layer 103, and a plurality of trenches 107 are formed in a direction perpendicular to the longitudinal direction of an $N^+$ emitter region 105 so as to be arranged in parallel at certain intervals (pitches). The $N^+$ emitter region 105 is selectively formed on the P base layer 104 so as to be adjacent to an outer upper sidewall of each of the trenches 107.

Each trench 107 is formed to extend from a top of the $N^+$ emitter region 105 to a depth reaching the inside of the $N^-$ semiconductor layer 103, and a trench gate electrode 110 of an MOS transistor is buried in the trench 107. That is, the gate electrode 110 of polysilicon or the like is provided in the trench through a gate insulating film 108. A part of the P base region 104 which is positioned in a peripheral part opposed to the gate electrode 110 through the gate insulating film 108 and located between the $N^+$ emitter region 105 and the carrier stored region (CS layer) 113 functions as the channel region.

An interlayer insulation film 109 is appropriately formed to cover the whole upper surface of the gate electrode 110 and a part of the surface of the $N^+$ emitter region 105 by setting a mask pattern. An emitter electrode 111 is formed so as to cover a part of the surface of the P base region 104 and the $N^+$ emitter region 105 (a region which is not covered with the interlayer insulation film 109) and the surface of the interlayer insulation film 109. Thus, the emitter electrode 111 is connected to both the base region 104 and the emitter region 105, so that the emitter electrode 111 and the collector electrode 112 function as a pair of main electrodes.

In this construction of the CSTBT shown in FIG. 1, since the surface area of the MOS can be also miniaturized to be about 1/10 as compared with that of a planar gate IGBT, its characteristics can be improved. In addition, according to the planar gate IGBT, a current flows in a current path formed in a region sandwiched by the P base layers on the surface and an amount of the voltage drop is large at this part. Meanwhile, according to the CSTBT of this embodiment, since the gate electrode 110 is formed so as to penetrate the P base layer 104 and the carrier stored region (CS layer) 113, and its current path is not sandwiched by the P base layers, its characteristics can be improved.

Furthermore, since the carrier stored region (CS layer) 113 which is the $N^-$ layer for storing the carriers is formed under the P base region 104, holes from the $P^+$ substrate 101 are prevented from passing to the emitter electrode 111 and the holes are stored in the carrier stored region (CS layer) 113 positioned under the P base region 104. As a result, the ON voltage can be further lowered as compared with the TIGBT which does not have a carrier stored region.

Figure 15:
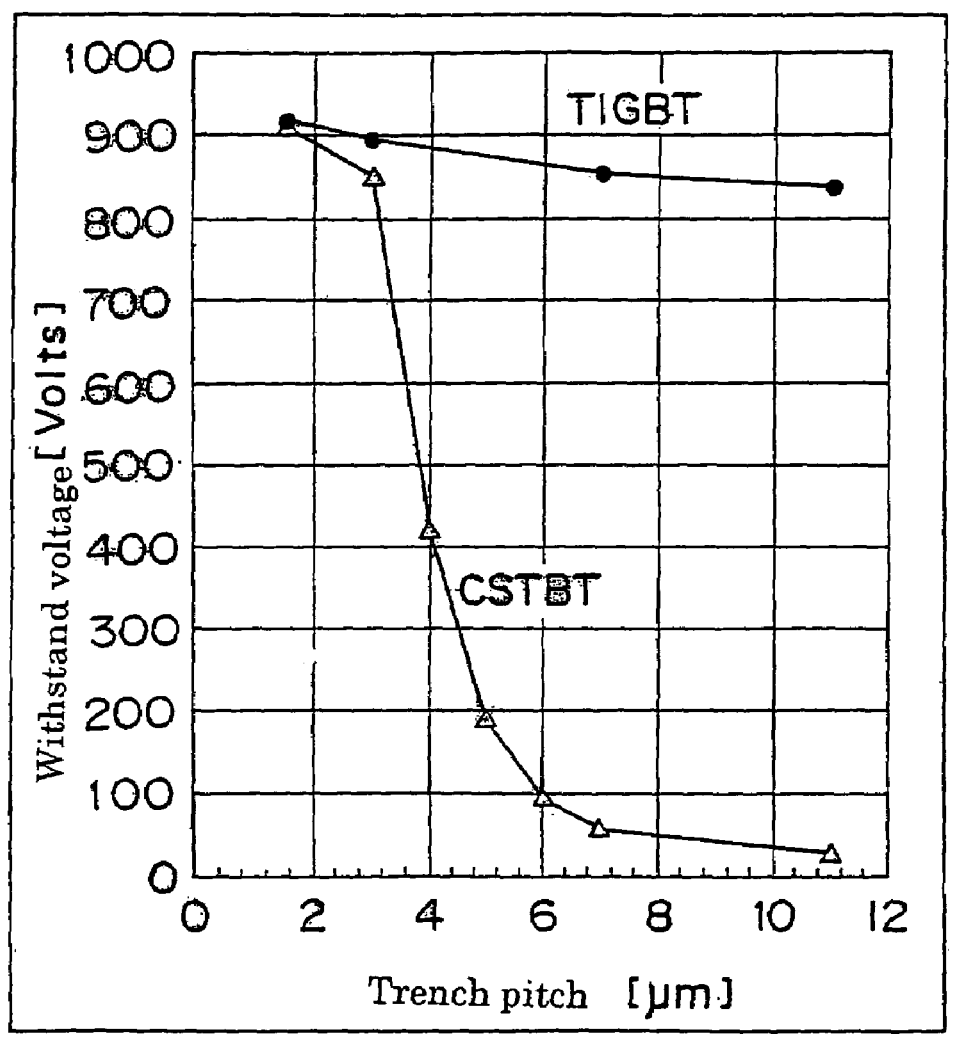
FIG. 15 is a graph showing a relation between a trench pitch and withstand voltage variation in the conventional TIGBT and CSTBT.
Figure 16:
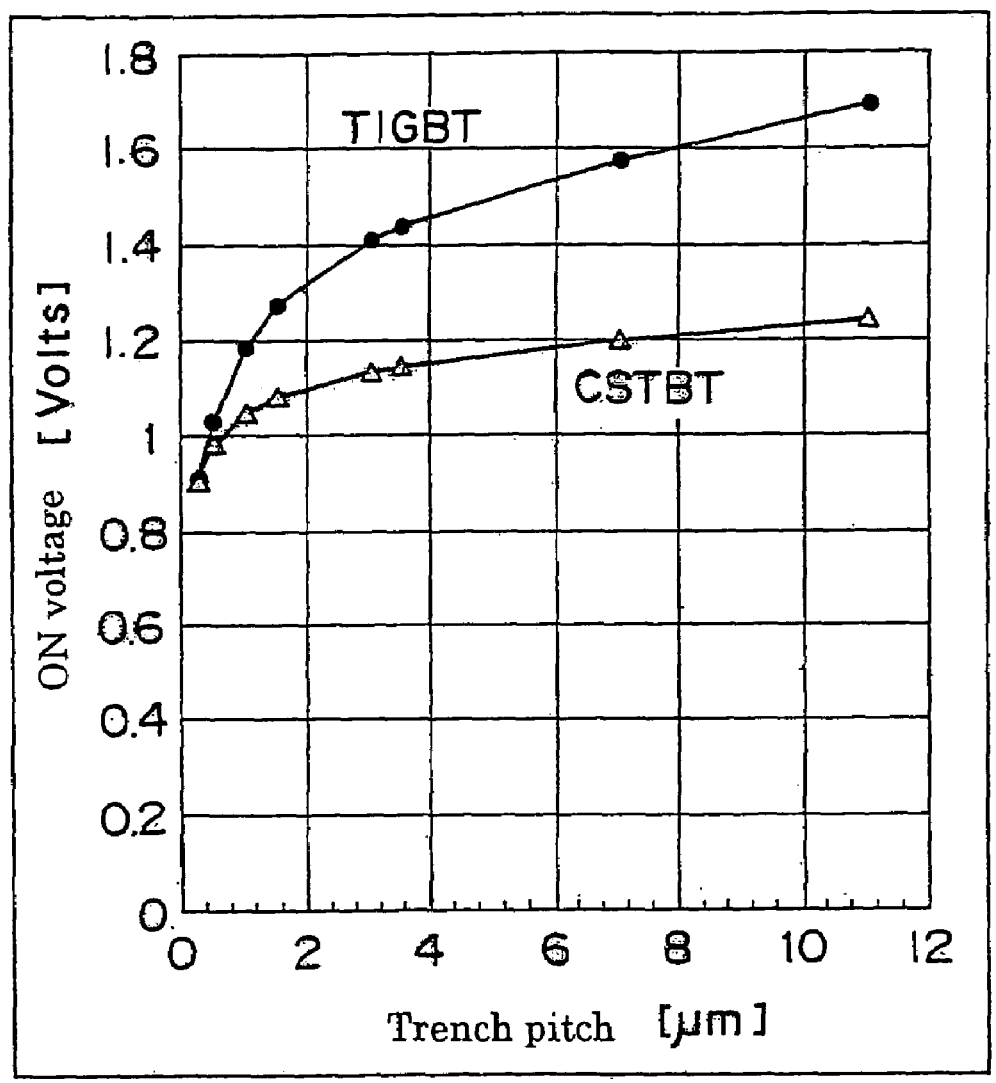
FIG. 16 is a graph showing a relation between a trench pitch and an ON voltage value in the conventional TIGBT and CSTBT.
Figure 17:
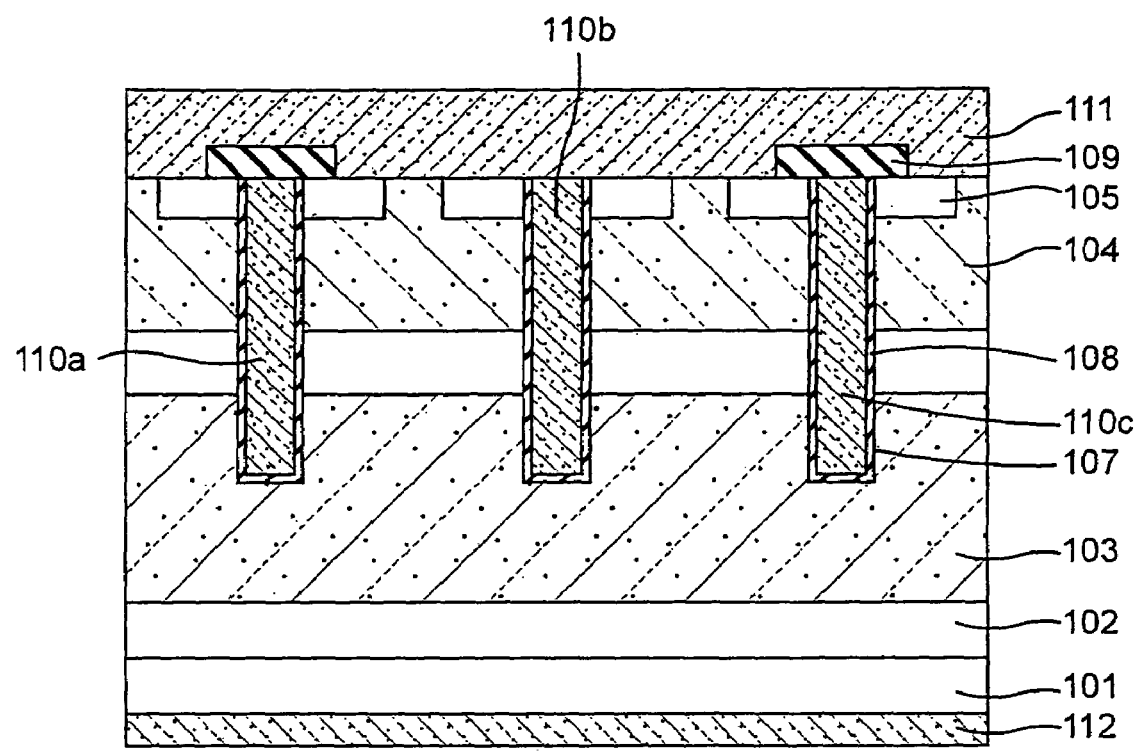
FIG. 17 is a view schematically showing a conventional improved CSTBT.
Figure 18:
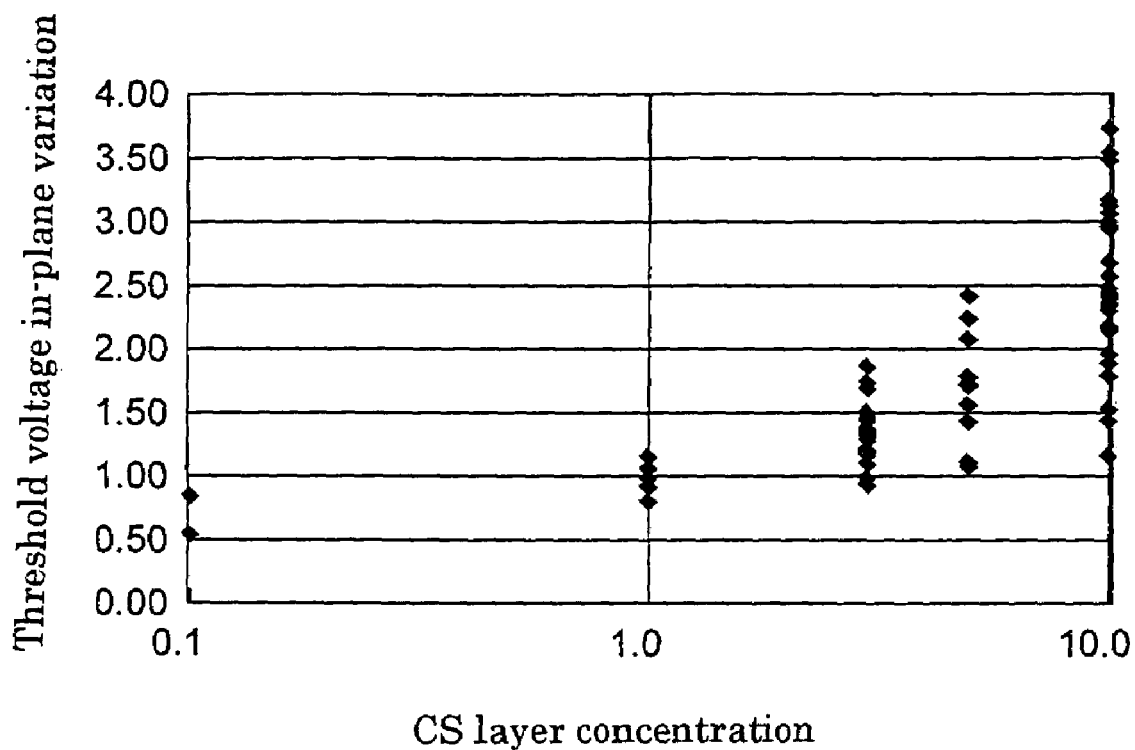
FIG. 18 is a graph showing a relation between a conventional CS layer concentration and in-plane variation of a threshold voltage.
Figure 19:
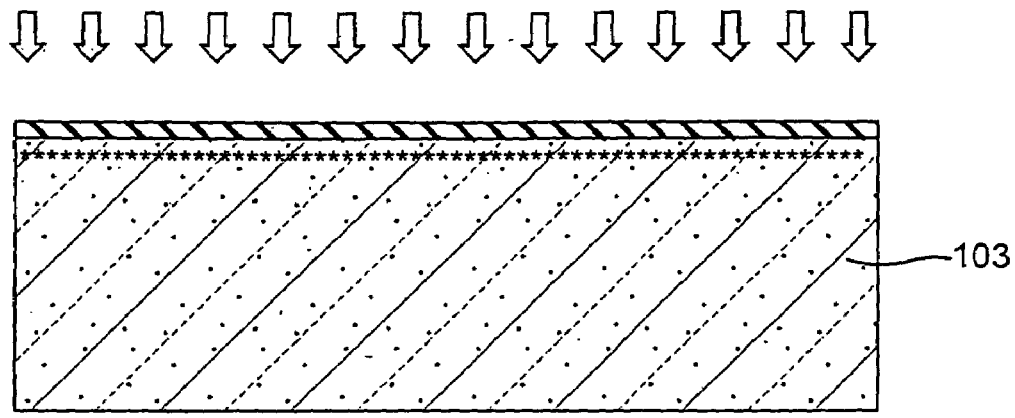
FIG. 19 is a schematic sectional view for explaining a manufacturing step of the conventional CSTBT.
Figure 20:
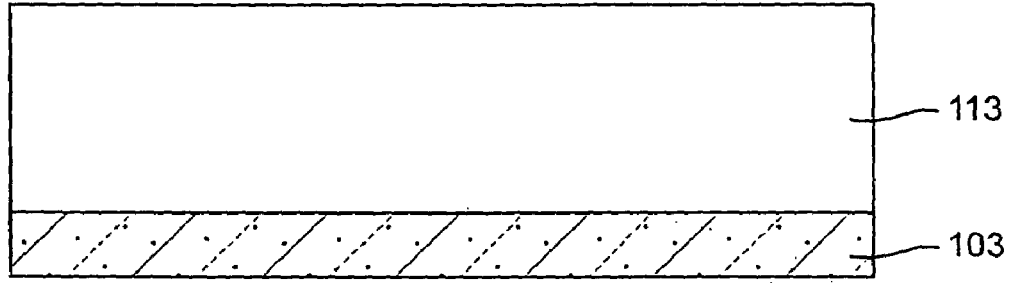
FIG. 20 is a schematic sectional view for explaining a manufacturing step of the conventional CSTBT.
Figure 21:
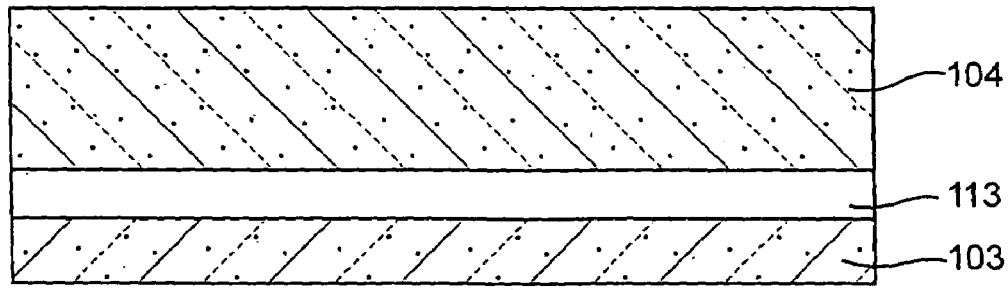
FIG. 21 is a schematic sectional view for explaining a manufacturing step of the conventional CSTBT.
Figure 22:
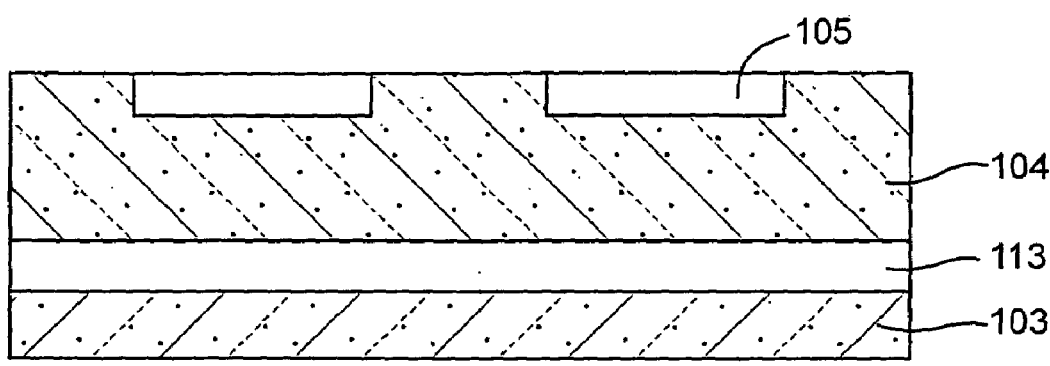
FIG. 22 is a schematic sectional view for explaining a manufacturing step of the conventional CSTBT.
Figure 23:
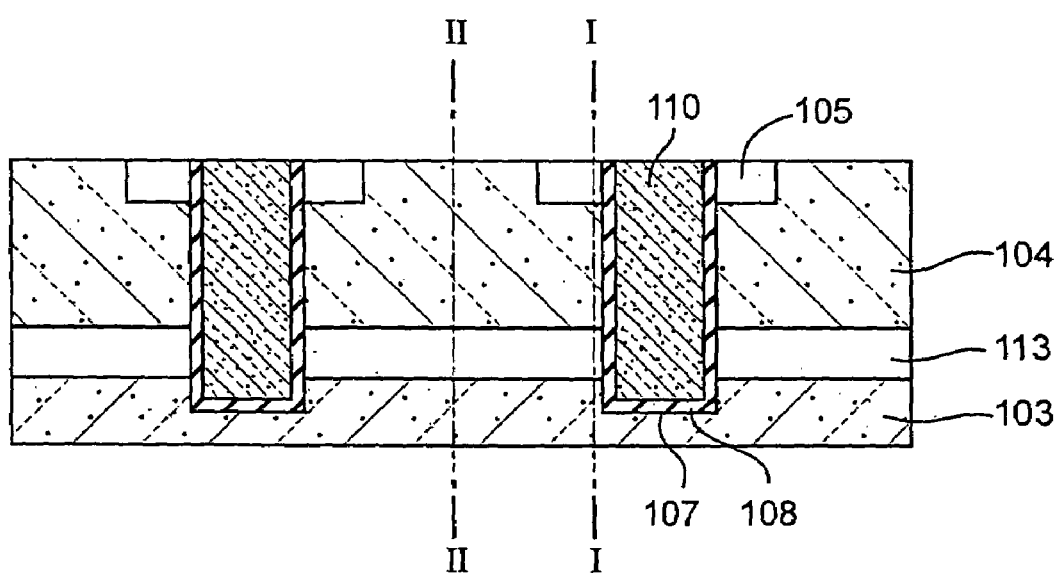
FIG. 23 is a schematic sectional view for explaining a manufacturing step of the conventional CSTBT.
Figure 24:
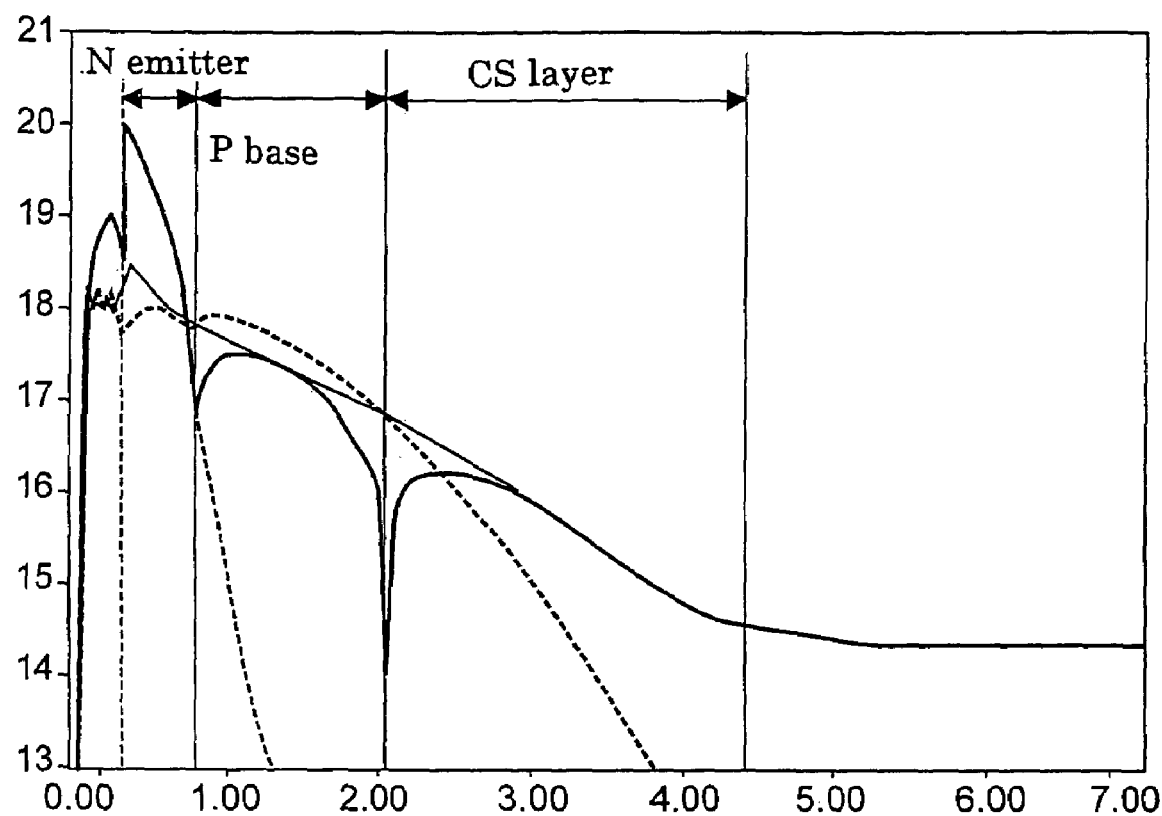
FIG. 24 is a graph showing a result of simulation of a concentration profile at a sectional position I—I shown in FIG. 23.
Figure 25:
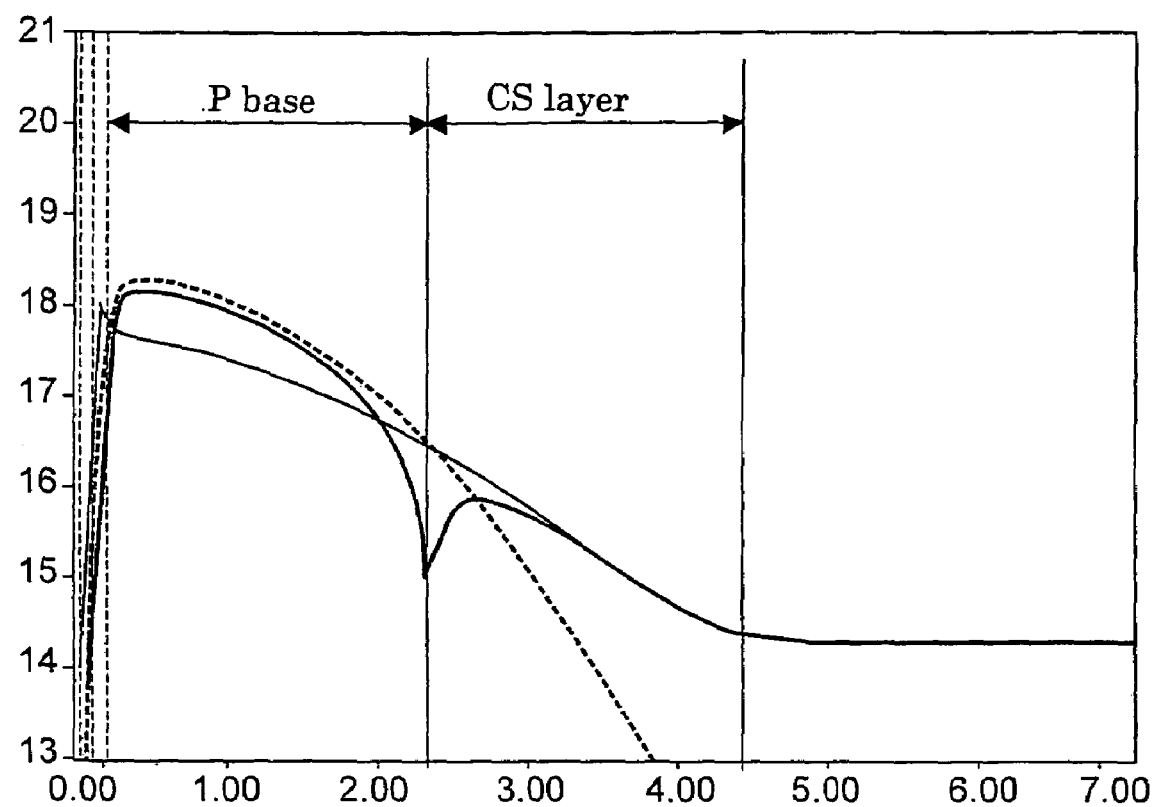
FIG. 25 is a graph showing a result of simulation of a concentration profile at a sectional position II—II shown in FIG. 23.

Although the ON voltage is raised in the TIGBT according to the result of the device simulation shown in FIGS. 15 and 16 used in the description of the prior art, since the ON voltage is not raised so much in the CSTBT, the CSTBT is more preferable as an electric power semiconductor element.

In this construction, when it is assumed that an impurity concentration of the first CS layer region 113$a$ just under the channel region is ND1 and an impurity concentration of the second CS layer region 113$b$ other than just under the channel region is ND2 in the carrier stored region (CS layer), the relationship between them is defined as ND1<ND2. More specifically, they are provided such that ND1<5E16 cm$^{-3}$, ND2<1E17 cm$^{-3}$ and ND2/ND1>5. More preferably, ND1<7E16 cm$^{-3}$, ND2<3E17 cm$^{-3}$ and ND2/ND1>5. The above relational expressions can be attained by selectively forming the CS layer in the unit cell when the CS layer is formed. By this constitution, rise of the ON voltage can be prevented, and variation in the threshold voltage (VGEth) can be considerably improved.

(Embodiment 2)

Figure 2:
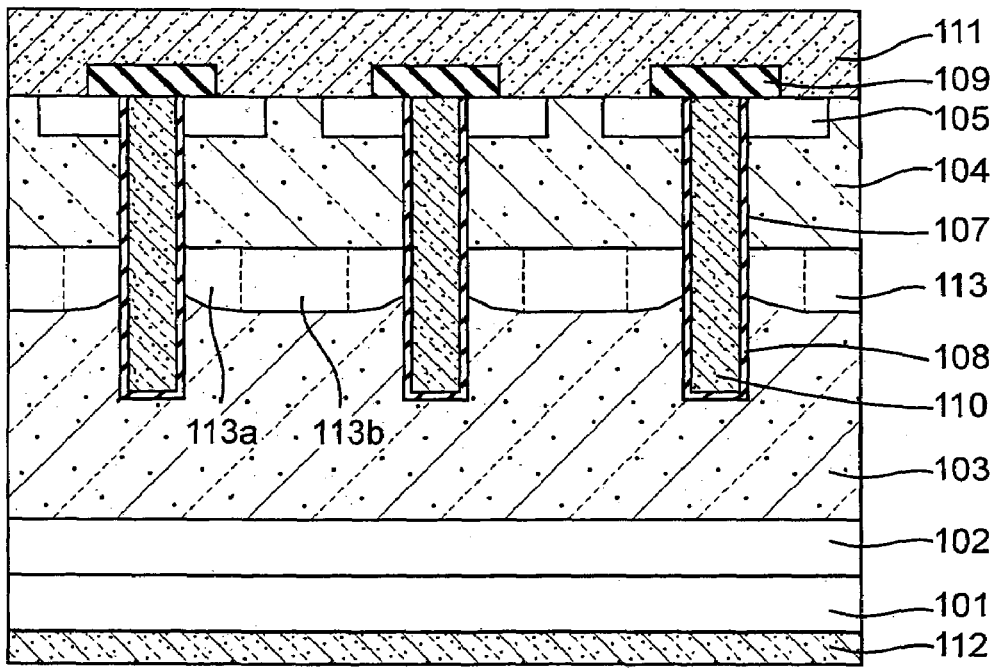
FIG. 2 is a sectional view schematically showing an example of a CSTBT according to an embodiment 2 of the present invention.

FIG. 2 is a sectional view schematically showing an example of a CSTBT according to an embodiment 2 of the present invention, and FIGS. 3 to 7 are schematic views showing a manufacturing flow from a step of forming a CS layer to a step of forming a trench gate in manufacturing of the CSTBT according to the embodiment 2. According to the CSTBT of the embodiment 2, a CS layer 113 comprises a first CS layer region 113$a$ just under a channel region and in the vicinity of a sidewall of a trench, and a second CS layer region 113$b$ other than just under the channel region. In this construction, the first CS layer region 113$a$ is thinner than the second CS layer region 113$b$. By this arrangement, an impurity concentration of the first CS layer region 113$a$ is lowered so that the variation in threshold voltage (VGEth) is controlled.

In addition, an impurity concentration of the second CS layer region 113$b$ is made higher than that of the first CS layer region 113$a$, so that a carrier storing effect can be maintained and an ON voltage can be lowered. As a result, the variation in the threshold voltage (VGEth) can be effectively improved.

Figure 3:
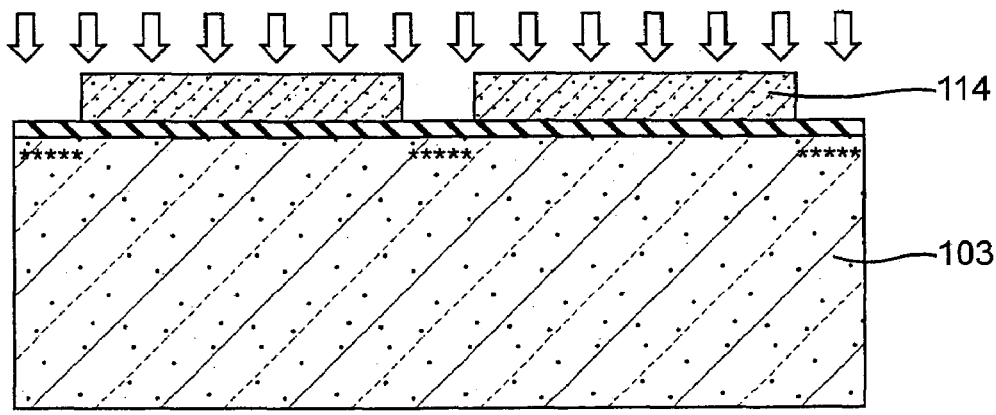
FIG. 3 is a schematic sectional view for explaining a manufacturing step of the CSTBT according to the embodiment 2 of the present invention.
Figure 4:
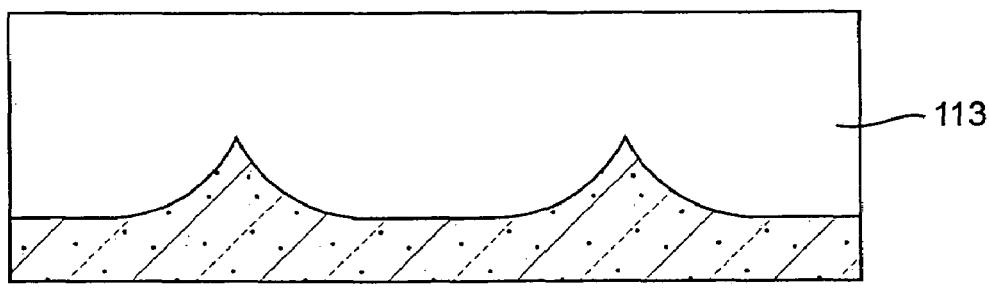
FIG. 4 is a schematic sectional view for explaining a manufacturing step of the CSTBT according to the embodiment 2 of the present invention.
Figure 5:
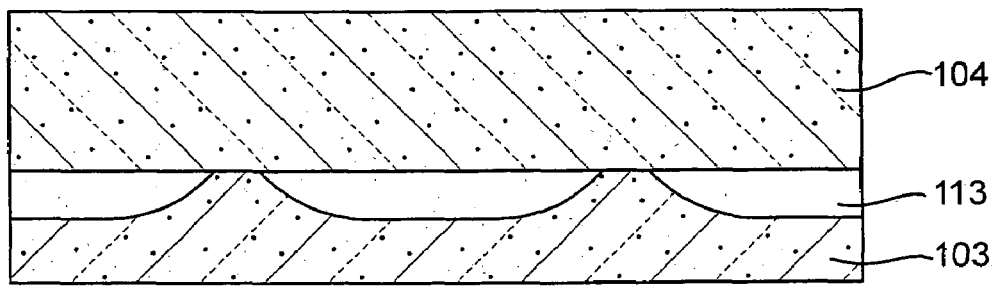
FIG. 5 is a schematic sectional view for explaining a manufacturing step of the CSTBT according to the embodiment 2 of the present invention.

Manufacturing steps of the CSTBT according to the embodiment 2 of the present invention will be described with reference to FIGS. 3 to 7 hereinafter. First, as shown in FIG. 3, ion implantation is selectively performed with e.g. phosphor through a resist 114 in a step of ion implantation for forming the CS layer. Then, as shown in FIG. 4, the CS layer 113 is formed in such a manner that a part just under the resist may be thinned by thermal diffusion. Then, as shown in FIG. 5, ion implantation is performed with e.g. boron and thermal diffusion is performed so that a P base layer 104 is formed and a plurality of CS layer regions 113 each having a thick center portion are formed.

Figure 6:
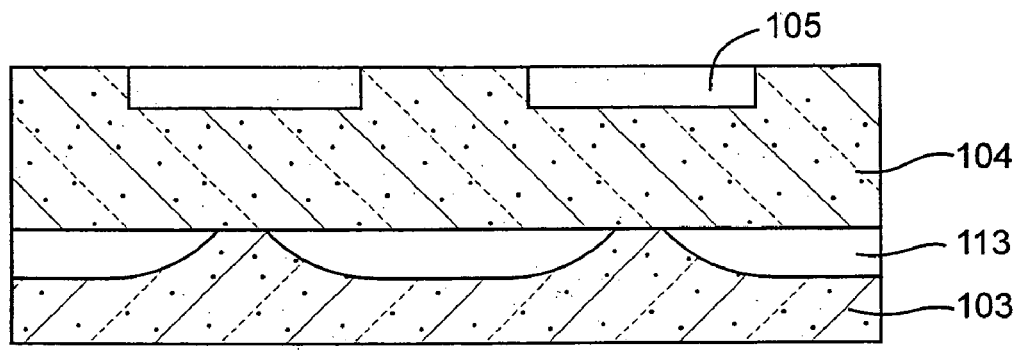
FIG. 6 is a schematic sectional view for explaining a manufacturing step of the CSTBT according to the embodiment 2 of the present invention.

Then, as shown in FIG. 6, ion implantation is selectively performed with e.g. arsenic, and thermal diffusion is performed to form an $N^+$ emitter region 105 in an upper surface of the P base layer 104 so that a position of the $N^+$ emitter region 105 corresponds to a region between the CS layer regions 113. Although the ion implantation was performed on an entire surface of a cell region in the prior art, since the ion implantation is partially performed through the resist in this embodiment as can be seen from FIGS. 5 and 6, each of a plurality of the CS layer regions 113 has the thick center portion and thinned side ends.

Figure 7:
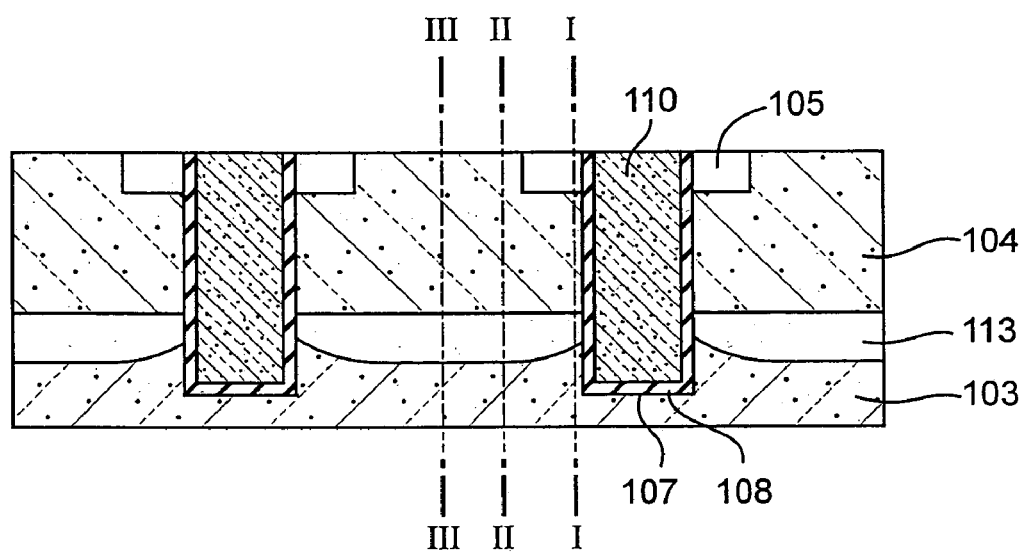
FIG. 7 is a schematic sectional view for explaining a manufacturing step of the CSTBT according to the embodiment 2 of the present invention.

Then, as shown in FIG. 7, a trench 107 is formed so as to pass through the $N^+$ emitter region 105, P base layer 104 and a region between the CS layer regions 113. Then, a gate insulating oxide film 108 is formed on an inner wall of the trench 107 and a gate electrode 110 of e.g. polysilicon is buried in the trench 107 to provide a gate region.

In general, after the trench is formed, a sidewall portion of the trench which becomes a channel region is cleaned, and a thermal oxidation treatment is performed thereon to remove and recover a damage layer. Thus, boron in the channel region segregates and an effective P base concentration is lowered.

As can be clear from the illustrated constitution, the impurity concentration of the CS layer region 113a just under the channel region finally formed in the vicinity of the sidewall portion of the trench gate becomes lower than that of the other CS layer region (i.e., center CS layer region 113b).

Figure 8:
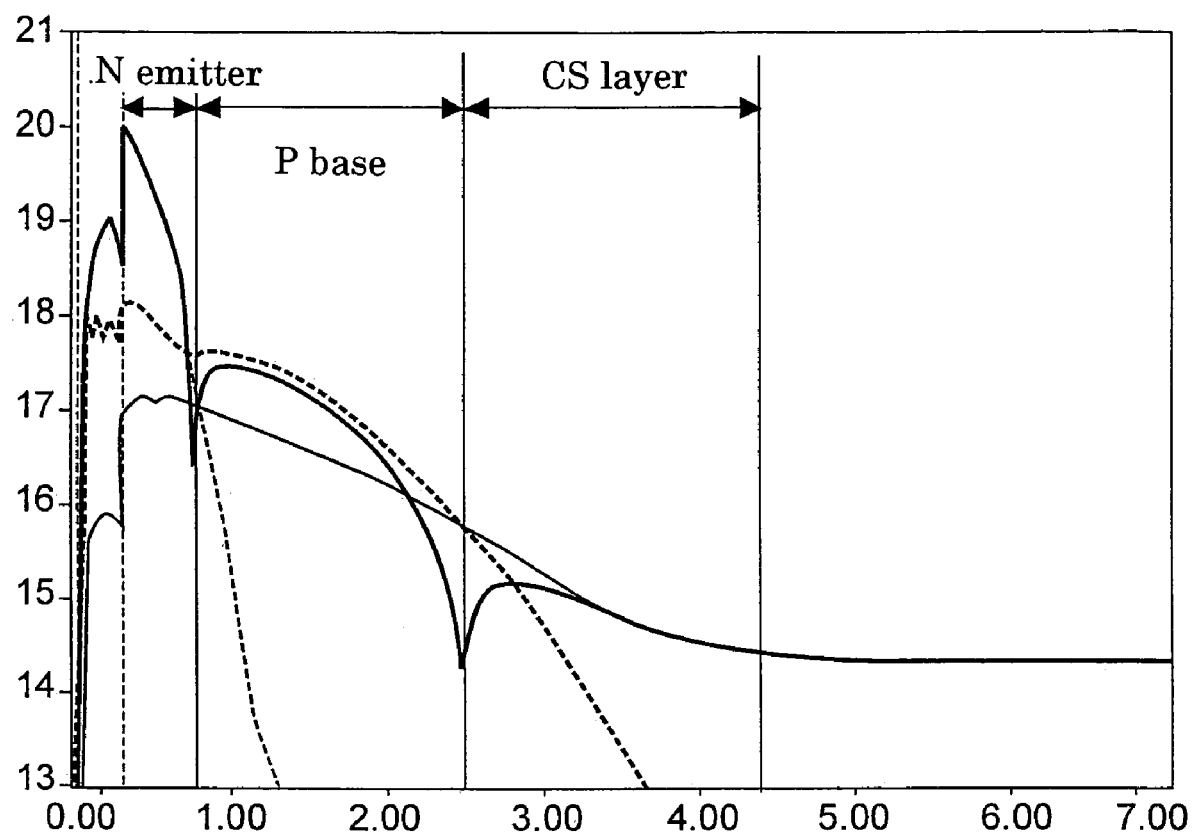
FIG. 8 is a graph showing a result of simulation of a concentration profile at a sectional position I—I in the CSTBT shown in FIG. 7.
Figure 9:
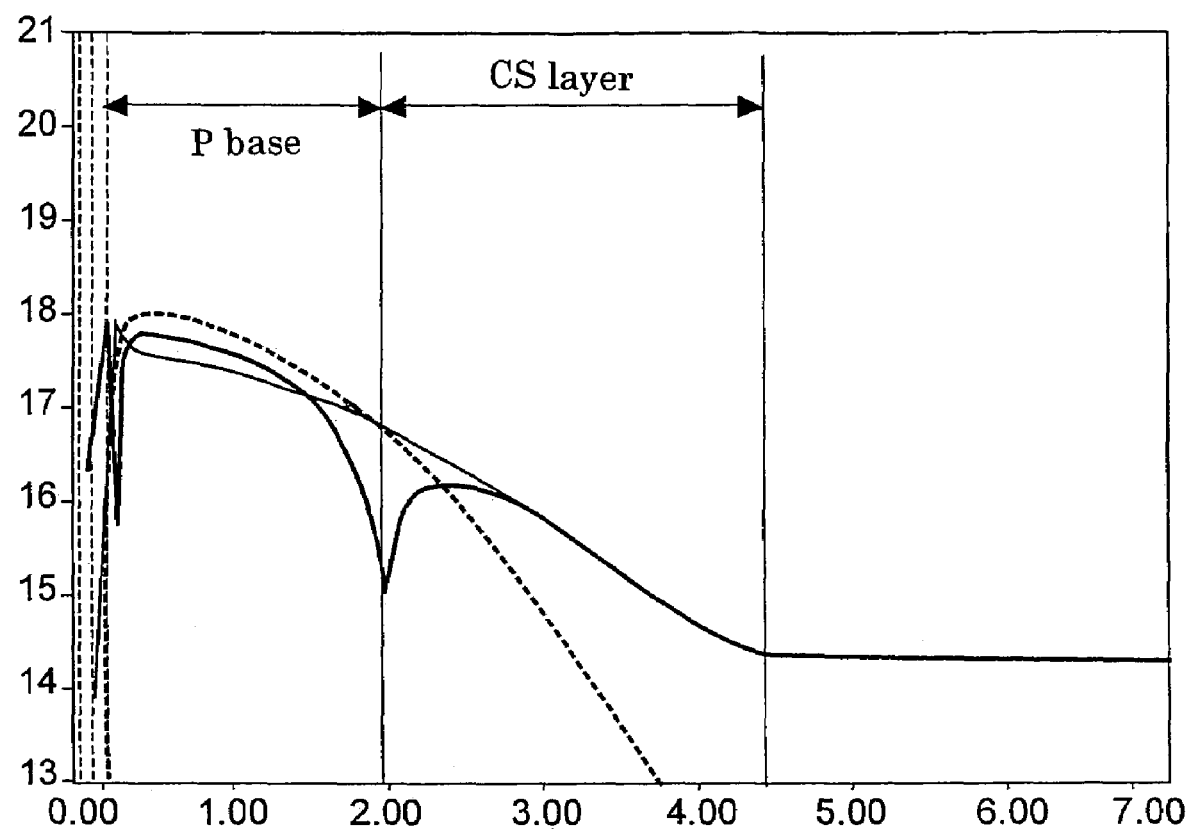
FIG. 9 is a graph showing a result of simulation of a concentration profile at a sectional position II—II in the CSTBT shown in FIG. 7.
Figure 10:
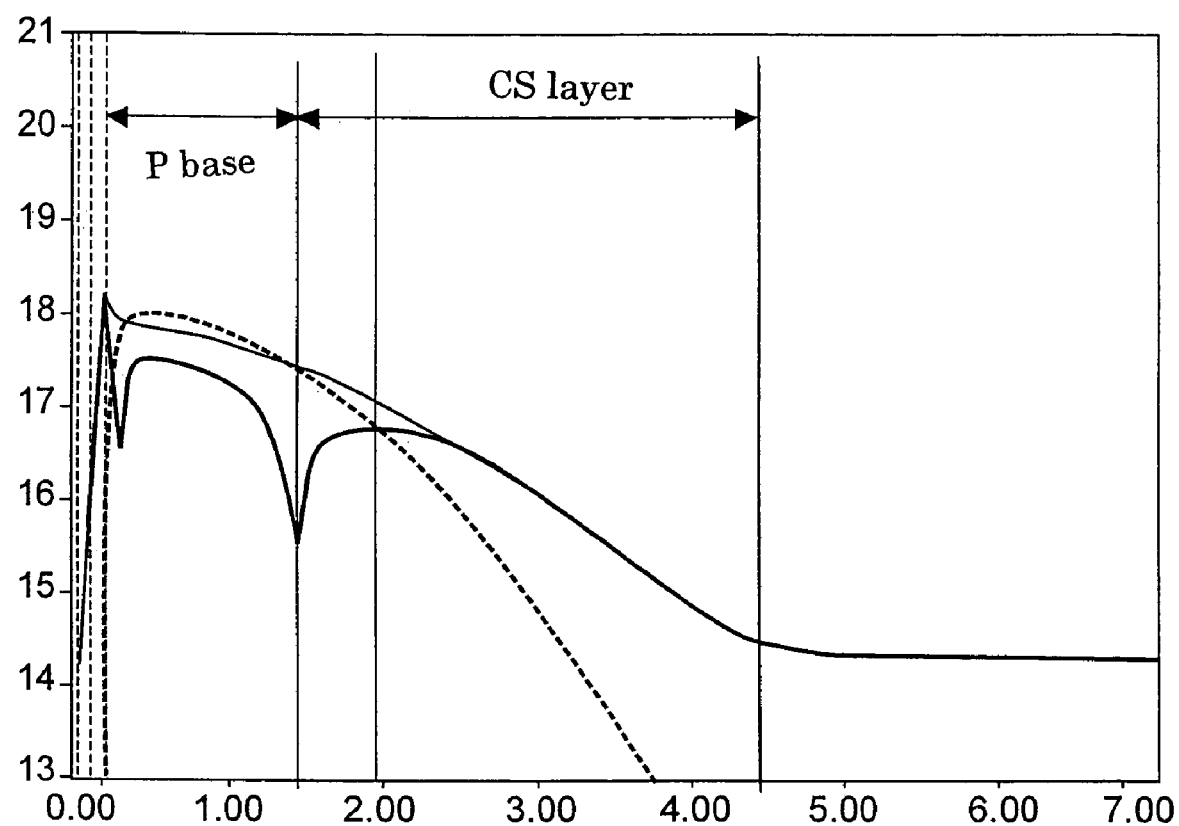
FIG. 10 is a graph showing a result of simulation of a concentration profile at a sectional position III—III in the CSTBT shown in FIG. 7.

FIGS. 8, 9 and 10 are graphs showing results of simulation calculations of concentration profiles at sectional positions I—I, II—II and III—III in the CSTBT provided by the above steps shown in FIG. 7, respectively. As shown in FIGS. 8 to 10, it is found that the impurity concentration of the CS layer (at sectional position I—I) just under the channel region is lower than those CS layers at the center of the cells (at the sectional positions II—II and III—III), which is reverse in relationship to the conventional type.

That is, when the gate voltage is applied, although the CS layer region 113a just under the channel region is changed from the $N^-$ layer to the $N^+$ layer because charges are stored, the CS layer region 113b other than just under the channel region can be made as the CS layer having a high-concentration as much as possible in this embodiment. As a result, the variation in threshold voltage (VGEth) can be effectively prevented and the ON voltage can be lowered.

(Embodiment 3)

Figure 11:
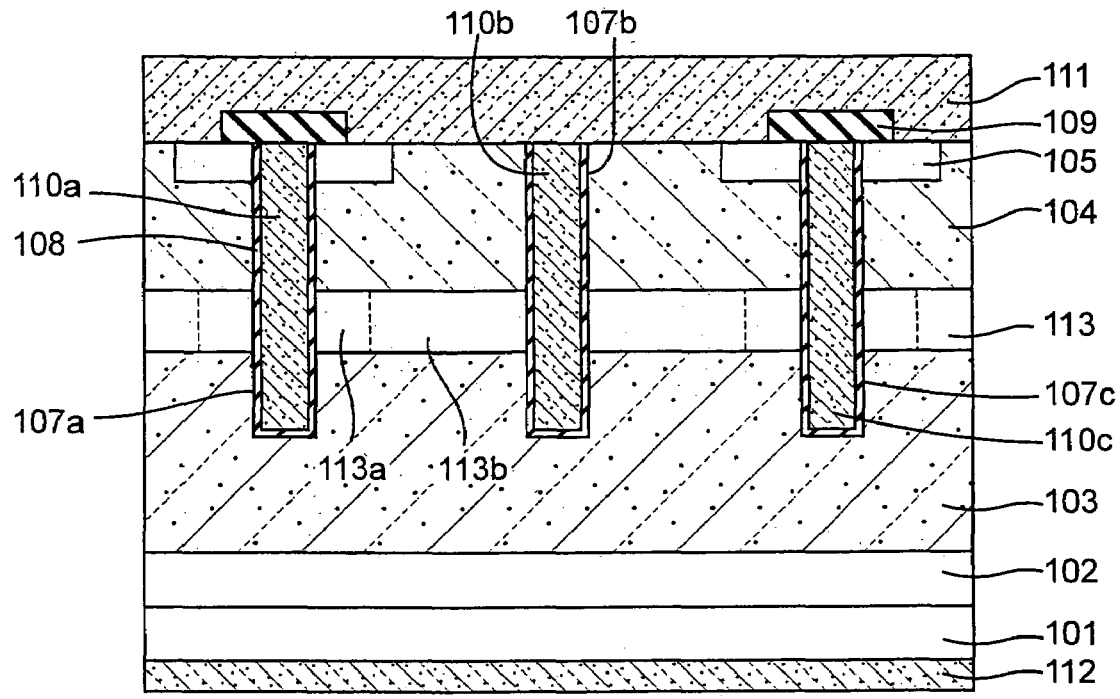
FIG. 11 is a sectional view schematically showing an example of a CSTBT according to an embodiment 3 of the present invention.

FIG. 11 is a sectional view schematically showing an example of a CSTBT according to an embodiment 3 of the present invention. The CSTBT according to the embodiment 3 is a modified example of the embodiment 1 shown in FIG. 1, wherein a dummy trench gate is used as the second trench gate. That is, since a cell of a second trench gate electrode 110b is directly connected to an emitter electrode 111, a gate voltage $V_{GE}$ is 0V so that the second trench gate is a dummy gate region which does not function as a gate. Thus, there is an advantage that a withstand voltage is not lowered while a cell size is the same as that of the conventional TIGBT or CSTBT. Note that, in this embodiment, the phrase "second trench gate" means a dummy trench gate as defined in the above constitution.

For example, in the case where two trench gates out of three are connected to the emitter electrode 111 in a trench gate region formed in a stripe shape, a gate capacity and a short-circuit current can be reduced to be ⅓. That is, it means that the gate capacity and the short-circuit current can be relatively freely selected.

As shown in FIG. 11, for example, when insulating oxide films are formed on the first and third gate electrodes 110a and 110c in a step of forming an interlayer insulating films 109, the gate capacity and short-circuit current can be freely selected by changing a mask pattern to be set, and thus, a degree of design can be improved.

More specifically, the first, second and third trenches 107a, 107b and 107c are selectively formed in a P base region 104, and the first, second (i.e., dummy) and third gate electrodes 110a, 110b and 110c are buried in the first, second and third trenches 107a, 107b and 107c through the gate insulating oxide films 108, respectively. Each trench has a depth reaching the inside of the $N^-$ semiconductor (base) layer 103, and emitter regions 105 are formed in the vicinity of the upper sidewalls of the first and third trenches 107a and 107c. The P base region 104 and the emitter region 105 are both connected to the emitter electrode 111.

In the above constitution of the CSTBT, only the P base regions along the first and third gate electrodes 110a and 110c work as the channel regions, and the P base region along the second gate electrode (i.e., dummy gate) 110b is used as a dummy trench which does not work as a channel region. Thus, a plurality of such dummy second gate electrodes 110b are arranged regularly.

In addition, in a carrier stored region (CS layer) 113, when it is assumed that an impurity concentration of a first carrier stored layer (CS layer) region 113a located just under the channel region is set to ND1 and an impurity concentration of a second carrier stored layer (CS layer) region 113b other than the region just under the channel region is set to ND2, the relationship of the impurity concentrations is defined as ND1<ND2. More specifically, they are provided such that ND1<5E16 cm$^{-3}$, ND2<1E17 cm$^{-3}$ and ND2/ND1>5. The above relational expressions can be attained by selectively forming the CS layer in a unit cell when the CS layer is formed. Thus, the same effect as in the embodiment 1 can be obtained.

In addition, according to the constitution shown in FIG. 11, a parasitic operation can be prevented by setting a potential of the dummy trench gate electrode 110b at the same value as that of the emitter electrode 111. However, the present invention is not limited to this and that the potential may be different from that of the emitter electrode 111.

(Embodiment 4)

Figure 12:
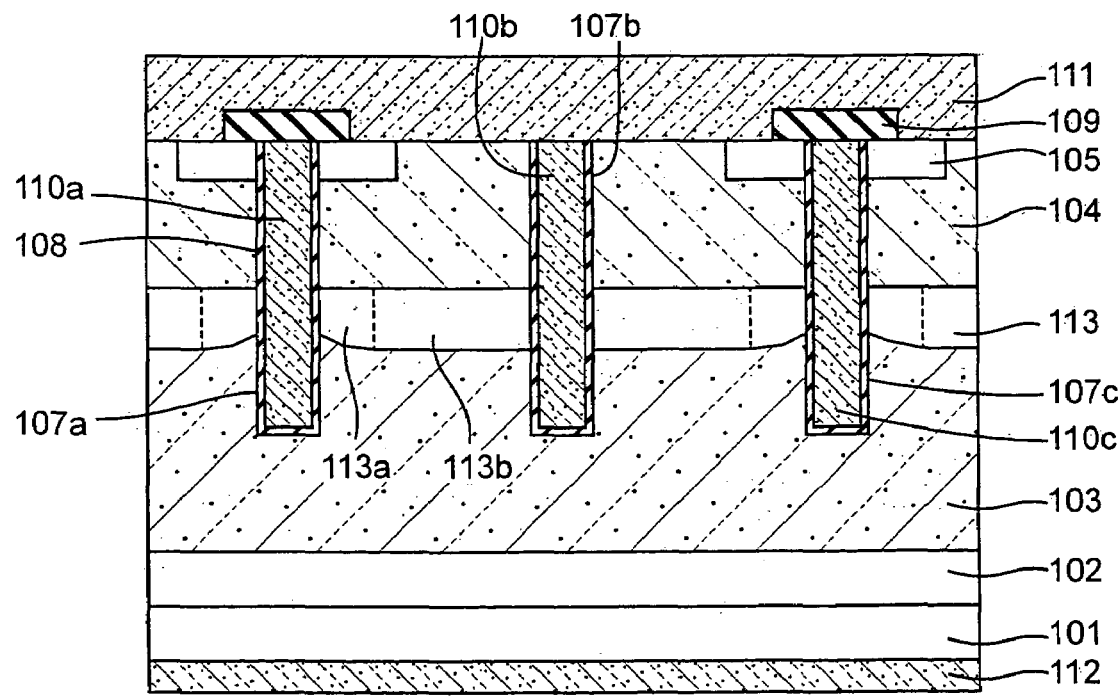
FIG. 12 is a sectional view schematically showing an example of a CSTBT according to an embodiment 4 of the present invention.
Figure 13:
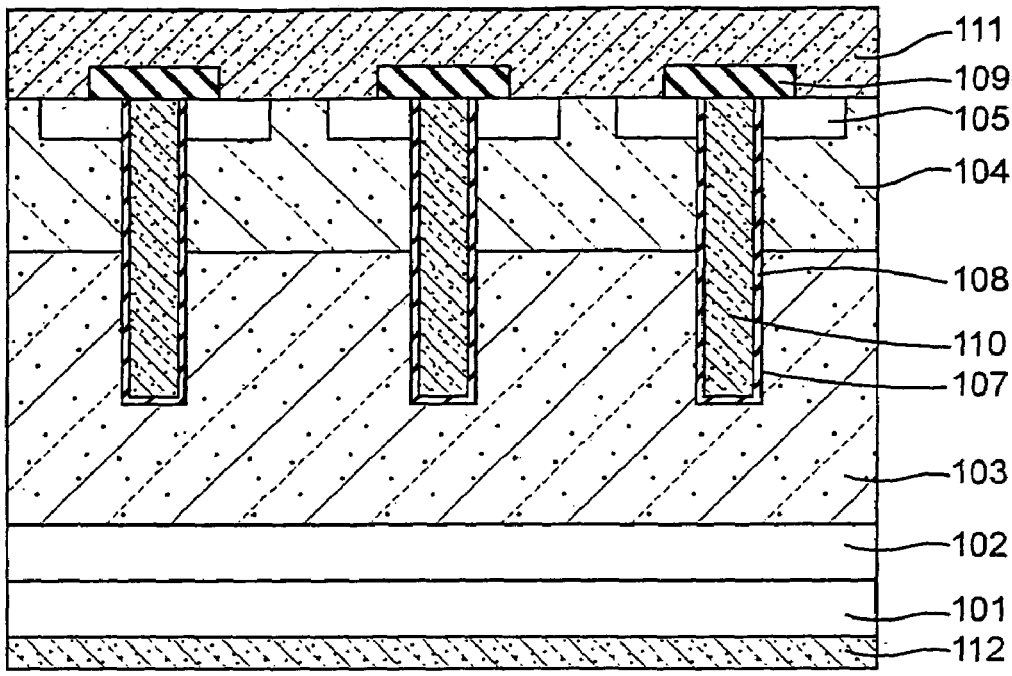
FIG. 13 is a sectional view showing an example of a structure of a conventional CIGBT.
Figure 14:
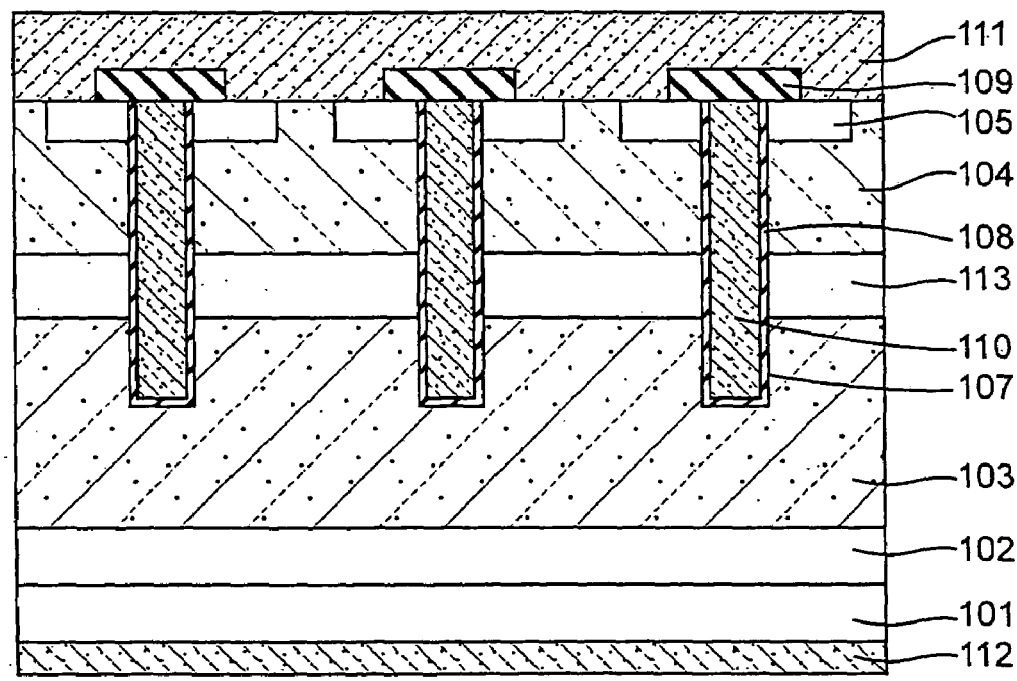
FIG. 14 is a sectional view schematically showing a conventional CSTBT.

FIG. 12 is a sectional view schematically showing an example of a CSTBT according to an embodiment 4 of the present invention. The CSTBT according to the embodiment 4 is a modified example of the embodiment 2 shown in FIG. 2, wherein a dummy trench gate is used as the second trench gate in the CSTBT.

More specifically, the first, second and third trenches 107a, 107b and 107c are selectively formed in the P base region 104, and each of them has a depth reaching the inside of an N⁻ semiconductor (base) layer 103. The first, second and third gate electrodes 110a, 110b and 110c are buried in the first, second and third trenches 107a, 107b and 107c through a gate insulating oxide film 108, respectively. Emitter regions 105 are formed in the vicinity of the upper sidewalls of the first and third trenches 107a and 107c, and the P base region 104 and the emitter region 105 are both connected to the emitter electrode 111.

In the above constitution of the CSTBT, only the P base region 104 along the first and third gate electrodes 110a and 110c work as a channel region. Meanwhile, since the second gate electrode 110b is set at the same potential as that of the emitter electrode 111, the P base region 104 along the second gate electrode (i.e., dummy gate) 110b is used as the dummy trench which does not work as the channel region.

In a carrier stored region (CS layer) 113, when it is assumed that an impurity concentration of a carrier stored layer (i.e., first CS layer portion) 113a located just under the channel region is set to ND1 and an impurity concentration of a carrier stored layer (i.e., second CS layer portion) 113b located other than just under the channel region is set to ND2, the relationship between the two impurity concentrations are defined by ND1<ND2. The above relational expressions can be attained by selectively forming the CS layer in a unit cell when the CS layer is formed.

More specifically, a thickness of the first CS layer region 113a is made to be smaller than that of the second CS layer region 113b, so that the impurity concentration of the first CS layer region 113a formed just under the channel region in the vicinity of the sidewall of the trench gate may be lower than that of the other region (i.e., second CS layer region 113b) which is located in the central portion of the cell.

That is, by this construction of the present embodiment, when a gate voltage is applied, the first CS layer region 113a just under the channel region is changed from the N⁻ layer to the N⁺ layer because charges are stored. Meanwhile, the other i.e., second) CS layer region 113b can have a high concentration as much as possible. As a result, variation in threshold voltage (VGEth) can be effectively suppressed and an ON voltage can be lowered. Thus, the same effect as in the embodiment 2 can be obtained.

Furthermore, according to the embodiment 4, the cell of the second gate electrode part 110b connected to the emitter electrode 111 is a dummy gate region, and there is an advantage that a withstand voltage is not lowered while a cell size is the same as that of the conventional TIGBT or CSTBT. As a result, a gate capacity and a short-circuit current can be relatively freely selected.

In addition, in the constitution shown in FIG. 12, a parasitic operation can be prevented by setting a potential of the dummy trench at the same value as that of the emitter electrode. However, the present invention is not limited to this and that potential may be different from that of the emitter electrode.

As an application of the present invention, there can be provided an insulated gate semiconductor device in which a gate capacity and a short-circuit current can be controlled and variation in threshold voltage (VGEth) is suppressed. In addition, the CS layer region just under the channel region is changed from an N⁻ layer to an N⁺ layer because charges are stored when the gate voltage is applied. Meanwhile, the CS layer region other than just under the channel region can have a high concentration as much as possible in the CSTBT of the present invention. Therefore, the CSTBT can be applied to an insulated gate semiconductor device in which an ON voltage is lowered.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An insulated gate semiconductor device comprising:
a first conductivity type first base region;
a second conductivity type collector region formed on a lower main face of the first conductivity type first base region;
a collector electrode connected to the collector region;
a second conductivity type second base region selectively formed on an upper main face of the first conductivity type first base region;
a first conductivity type carrier stored layer formed between the second base region and the first base region and having an impurity concentration higher than that of the second base region;
a first conductivity type emitter region selectively formed in the second base region;
a trench selectively formed in the second base region and having a depth reaching inside of the first conductivity type first base region;
a gate electrode buried in the trench through an insulation film; and
an emitter electrode connected to both the second base region and the emitter region,
wherein the second base region located in the periphery of the gate electrode functions as a channel region, and when it is assumed that an impurity concentration of a first carrier stored layer region located just under the channel region is ND1 and an impurity concentration of a second carrier stored layer region other than just under the channel region is ND2 in the carrier stored layer, the relationship between the impurity concentrations is defined by ND1<ND2.

2. The insulated gate semiconductor device according to claim 1, wherein the impurity concentration ND1 of the first carrier stored layer region and the impurity concentration ND2 of the second carrier stored layer region are defined by $ND1 < 7E16 cm^{-3}$, $ND2 < 3E17 cm^{-3}$ and $ND2/ND1 > 5$.

3. The insulated gate semiconductor device according to claim 1, wherein the trench has a first trench and a second trench,
a first gate electrode is buried in the first trench through the insulation film,
a dummy second gate electrode is buried in the second trench through the insulation film, and
only the second base region located in the periphery of the first gate electrode works as the channel region and the second base region located in the periphery of the dummy second gate electrode does not work as the channel region.

4. The insulated gate semiconductor device according to claim 3, wherein the impurity concentration ND1 of the first carrier stored layer region and the impurity concentration ND2 of the second carrier stored layer region is defined by $ND1 < 7E16 cm^{-3}$, $ND2 < 3E17 cm^{-3}$ and $ND2/ND1 > 5$.

5. The insulated gate semiconductor device according to claim 3, wherein a plurality of the dummy second gate electrodes are regularly arranged.

6. The insulated gate semiconductor device according to claim 5, wherein the impurity concentration ND1 of the first carrier stored layer region and the impurity concentration ND2 of the second carrier stored layer region is defined by $$ND1 < 5E16 cm^{-3}, ND2 < 1E17 cm^{-3} \text{ and } ND2/ND1 > 5.$$

7. The insulated gate semiconductor device according to claim 3, wherein a potential of the dummy second gate electrode is set to the same value as that of the emitter electrode, so that the second base region in the periphery of the dummy second gate electrode does not work as the channel region.

8. The insulated gate semiconductor device according to claim 1, wherein the carrier stored layer is selectively formed in a unit cell to obtain the relational expression of ND1<ND2.

* * * * *